(12) United States Patent
Christensen (10) Patent No.: US 7,581,959 B2
(45) Date of Patent: Sep. 1, 2009

(54) PRINTED CIRCUIT BOARD ENGAGEMENT SYSTEMS AND METHODS

(75) Inventor: Steven M. Christensen, Leander, TX (US)

(73) Assignee: Newlsys, Inc., San Jose, CA (US)

(*) Notice: Subject to any disclaimer, the term of this patent is extended or adjusted under 35 U.S.C. 154(b) by 145 days.

(21) Appl. No.: 11/742,286

(22) Filed: Apr. 30, 2007

(65) Prior Publication Data

US 2008/0264192 A1    Oct. 30, 2008

(51) Int. Cl.
*H01R 12/00*    (2006.01)
(52) U.S. Cl. .................. 439/64; 439/160; 439/259
(58) Field of Classification Search ........... 439/157, 439/160, 159, 325, 327, 310, 64, 65, 259
See application file for complete search history.

(56) References Cited

U.S. PATENT DOCUMENTS

| | | | |
|---|---|---|---|
| 2,976,510 A * | 3/1961 | Blain | 439/74 |
| 3,767,975 A * | 10/1973 | Glenn | 361/796 |
| 3,944,311 A * | 3/1976 | Sprenkle et al. | 439/157 |
| 4,223,934 A | 9/1980 | Cauceglia et al. | |
| 4,775,260 A | 10/1988 | Kecmer | |
| 4,778,401 A | 10/1988 | Boudreau et al. | |
| 5,152,052 A | 10/1992 | Rantala et al. | |
| 5,268,821 A * | 12/1993 | Wong | 361/796 |
| 5,317,481 A * | 5/1994 | Hillis et al. | 361/796 |
| 5,647,748 A | 7/1997 | Mills et al. | |
| 5,906,501 A | 5/1999 | Longueville et al. | |
| 5,967,825 A * | 10/1999 | Lima et al. | 439/372 |
| 6,062,894 A | 5/2000 | Barringer | |
| 6,148,506 A | 11/2000 | Vermette | |
| 6,260,261 B1 | 7/2001 | Marks et al. | |
| 6,373,713 B1 | 4/2002 | Jensen et al. | |
| 6,406,309 B1 | 6/2002 | Ennis et al. | |
| 6,535,394 B1 | 3/2003 | Hirzmann | |
| 6,608,759 B1 | 8/2003 | Barringer et al. | |
| 6,709,276 B2 | 3/2004 | Barringer et al. | |
| 6,934,162 B2 | 8/2005 | Perez et al. | |
| 6,971,893 B2 | 12/2005 | Barringer et al. | |
| 7,068,498 B2 | 6/2006 | Bolich et al. | |
| 2008/0139024 A1 * | 6/2008 | Lee et al. | 439/153 |

* cited by examiner

*Primary Examiner*—Neil Abrams (57) ABSTRACT

In some embodiments, co-planar printed circuit boards (PCBs) are electrically connected by leveraging an applied external force to generate a higher in-plane PCB connection force. A crank-and-slider in-plane PCB translation assembly includes a pair of coupling arms parallel to a PCB plane and connected to the PCB, and a leveraging arm parallel to the PCB plane and coupled to the couplings arm and to a fixed support. A guide pin is connected to the PCB and to a first end of each coupling arm, and fits through a longitudinal guide slot defined in the fixed support. A drive pin is connected to an opposite end of each coupling arm and fits through a transverse drive slot defined in the fixed support. The leveraging arm moves the drive-pin end of the coupling arm transversely, e.g. linearly or along an arcuate trajectory, thus pushing the guide-pin end to move the PCB longitudinally.

23 Claims, 11 Drawing Sheets

PRINTED CIRCUIT BOARD ENGAGEMENT SYSTEMS AND METHODS

BACKGROUND

The invention relates to system and method for electrically connecting components such as printed circuit boards, and in particular to systems and method for electrically connecting printed circuit boards to each other.

Printed circuit boards (PCB) and other components of computer systems often need to be inserted or removed from the system, and/or connected to other system components. Connecting different electrical connectors may require precisely aligning the connectors and applying controlled forces to join the connectors together without damaging the connectors or otherwise putting excessive strain on sensitive components. Joining such connectors may be challenging in environments subject to tight spatial and/or other geometric constraints, such as constraints on connector orientation and direction of movement.

SUMMARY

According to one aspect, an apparatus comprises a first printed circuit board having a first edge electrical connector; a second printed board substantially co-planar with the first printed circuit board and having a second edge electrical connector facing the first edge electrical connector; and an in-plane translation assembly coupled to the first printed circuit board, for moving the first printed circuit board relative to the second printed board within a major plane of the first printed circuit board and the second printed circuit board to connect the first edge electrical connector to the second edge electrical connector. The translation assembly comprises a fixed translation assembly support, a first coupling arm substantially parallel to the major plane and rigidly connected to the first printed circuit board, and a first leveraging arm substantially parallel to the major plane and coupled to the first coupling arm and to the fixed translation assembly support, for leveraging an external applied force to move the first coupling arm and thereby move the first printed circuit board relative to the second printed circuit board within the major plane to connect the first edge electrical connector to the second edge electrical connector.

According to another aspect, an in-plane printed circuit board translation assembly comprises: a fixed support plate having a major plane, the fixed support plate including a longitudinal guide slot and a transverse drive slot; a coupling arm substantially parallel to the major plane, an out-of-plane guide pin connected to the coupling arm and passing through the longitudinal guide slot, for connecting to a printed circuit board to translate the printed circuit board along a trajectory defined by the longitudinal guide slot; a drive arm substantially parallel to the major plane and pivotally connected to the coupling arm; and an out-of-plane drive pin pivotally connecting the coupling arm to the drive arm and passing through the transverse drive slot, for coupling a motion of the drive arm to the coupling arm to drive the guide pin along the longitudinal guide slot.

According to another aspect, a method of connecting a pair of co-planar printed circuit boards comprises: connecting a coupling arm to a first printed circuit board of the pair of printed circuit boards; connecting a leveraging arm to the coupling arm and to a fixed support; and employing the leveraging arm to leverage an external force applied to the leveraging arm to move the coupling arm along a plane of the printed circuit boards to connect a first electrical connector situated along an edge of the first printed circuit board to a second electrical connector situated along an edge of the second printed circuit board.

According to another aspect, a printed circuit board connection method comprises locking a first circuit board having a first edge electrical connector in a first mating position; and connecting a second edge electrical connector of a second printed circuit board to the first edge electrical connector by transversely moving a crank to longitudinally slide a pair of pins coupled to the crank and the second printed circuit board through a corresponding pair of longitudinal slots to lock the second printed circuit board in a second mating position.

BRIEF DESCRIPTION OF THE DRAWINGS

The foregoing aspects and advantages of the present invention will become better understood upon reading the following detailed description and upon reference to the drawings where:

FIGS. 1-A-B show top views of a printed circuit board assembly including two printed circuit boards prior to and after establishing an electrical connection between the two boards, respectively, according to some embodiments of the present invention.

FIGS. 2-A-B show isometric and top views of a connection region of two printed circuit boards prior to connection, according to some embodiments of the present invention.

FIG. 3-A-B show isometric and top views of a connection region of two connected printed circuit boards, according to some embodiments of the present invention.

FIG. 4-A-B show exploded and isometric views, respectively, of a printed circuit board translation assembly according to some embodiments of the present invention.

FIGS. 5-A-B show top views of the assembly of FIGS. 4-A-B in open and closed states, respectively, according to some embodiments of the present invention.

FIGS. 6-A-C illustrate a translation assembly crank handle formed by a knob having a spring-loaded plunger, according to some embodiments of the present invention.

FIG. 8-A shows a part of a translation assembly according to some embodiments of the present invention.

FIG. 8-B shows a detail of a printed circuit board assembly with a keyhole-standoff configuration having reversed gender relative to the configuration shown in FIGS. 2-A-B, according to some embodiments of the present invention.

FIGS. 9-A-B show isometric views of a printed circuit board and corresponding support before and after mounting the printed circuit board on the support, respectively, according to some embodiments of the present invention.

DETAILED DESCRIPTION OF PREFERRED EMBODIMENTS

In the following description, it is understood that all recited connections between structures can be direct operative connections or indirect operative connections through intermediary structures. Each recited element or structure can be formed by or be part of a monolithic structure, or be formed from multiple distinct structures. A set of elements includes one or more elements. A plurality of elements includes two or more elements. Any recitation of an element is understood to refer to at least one element. Unless otherwise required, any described method steps need not be necessarily performed in a particular illustrated order.

The following description illustrates embodiments of the invention by way of example and not necessarily by way of limitation.

Figure 1:
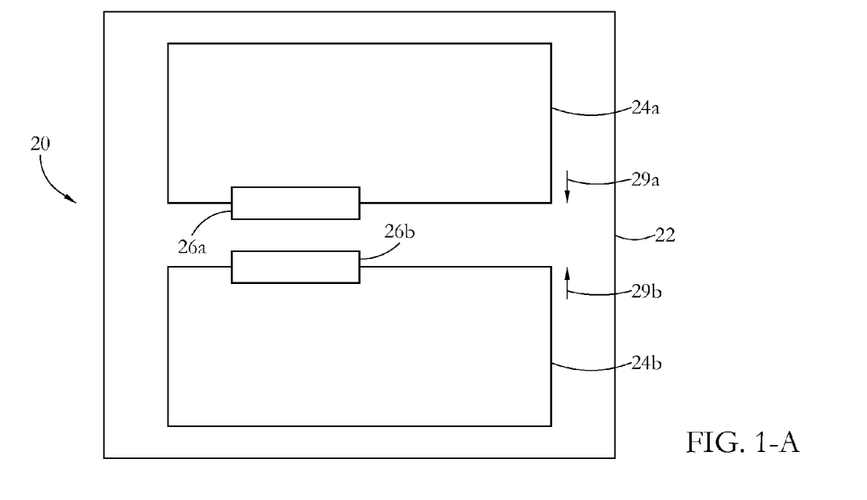

FIGS. 1-A-B show top views of a printed circuit board assembly 20 including two co-planar printed circuit boards (PCBs) 24a-b prior to and after establishing an electrical connection between PCBs 24a-b, respectively, according to some embodiments of the present invention. PCBs 24a-b are mounted on and generally parallel to a common planar fixed PCB support 22. PCBs 24a-b include corresponding matching edge electrical connectors 26a-b situated along outer edges of PCB 24a-b and facing each other. During a process of electrically interconnecting PCBs 24a-b, one or both of PCB 24a-b are movable relative to PCB support 22 along a longitudinal direction illustrated by the arrows 29a-b in FIGS. 1-A-B. As PCBs 24a-b are moved longitudinally toward each other, electrical connectors 26a-b engage and create an electrical connection between PCBs 24a-b.

Figure 2:
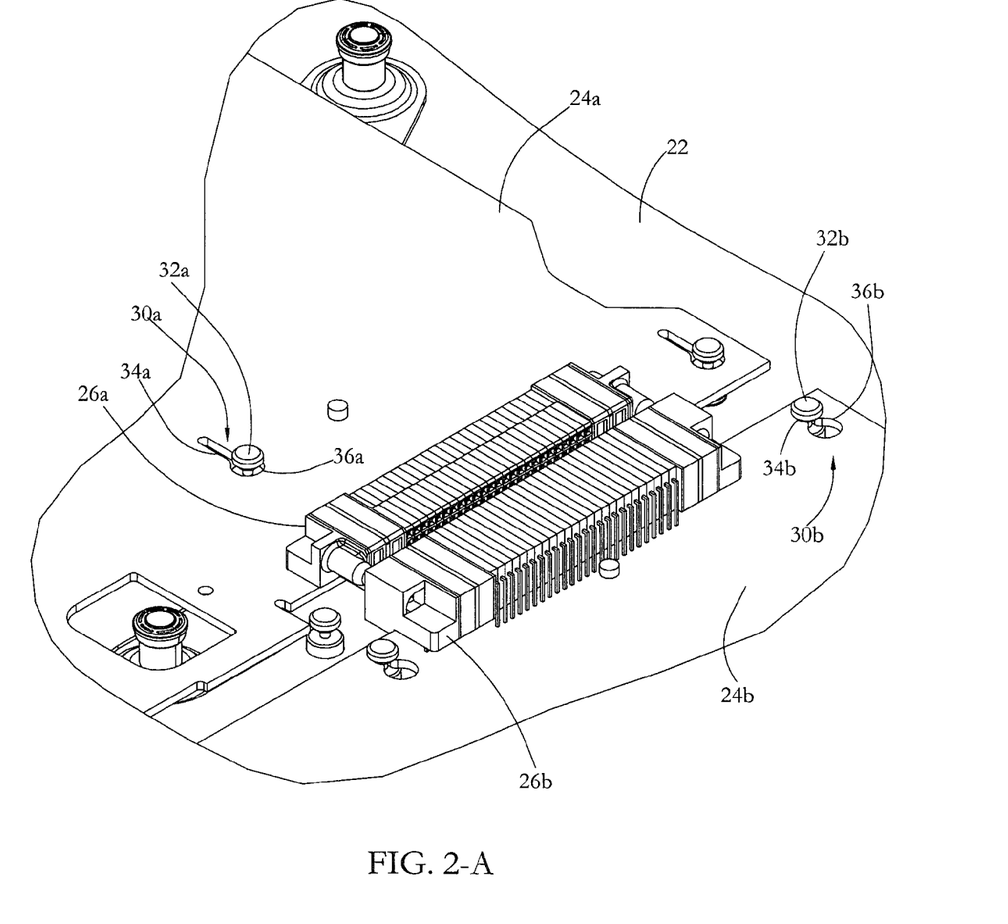

FIGS. 2-A-B show isometric and top views of a connection region of PCBs 24a-b prior to connection, according to some embodiments of the present invention. As shown, electrical connectors 26a-b are positioned facing laterally outward and facing each other along corresponding edges of PCBs 24a-b. Each PCB 24a-b includes a plurality of corresponding longitudinally-oriented keyhole apertures 30a-b. Keyhole apertures 30a-b include corresponding narrow longitudinal slots (channels) 34a-b and wider, circular insertion apertures 36a-b, respectively. Longitudinal slots 34a-b extend from insertion apertures 36a-b in a longitudinal direction away from connectors 26a-b, respectively. PCB support 22 includes or otherwise bears a plurality of fixed standoffs 32a-b positioned and sized to fit through corresponding keyhole apertures 30a-b. Each PCB 24a-b includes at least two transversely-spaced standoff/keyhole pairs, situated on each opposite transverse sides of connectors 26a-b. Standoffs 32a-b are slidable within keyhole apertures 30a-b between open and locked positions. FIGS. 2-A-B show PCB 24b in a locked position, and PCB 24a in an open (pre-assembly) position. Standoffs 32a-b include wide heads sized to fit through matching insertion apertures 36a-b, and narrower necks sized to fit through matching longitudinal slots 34a-b. Prior to connecting electrical connectors 26a-b, standoffs 32a-b are inserted through insertion apertures 36a-b. As electrical connectors 26a-b are moved longitudinally toward each other, standoffs 32a-b slide through longitudinal slots 34a-b. Standoffs 32a-b and keyhole apertures 30a-b transversely constrain the motion of electrical connectors 26a-b to a longitudinal trajectory, and facilitate keeping electrical connectors 26a-b aligned and precisely facing each other as PCBs 24a-b are moved longitudinally using a translation assembly as described below. As shown in FIG. 2-B, PCB support 22 includes a crank-lock aperture 92a for receiving a spring-loaded plunger of a crank handle 90a when crank handle 90a is in a closed position (shown in FIGS. 3-A-B), as described in detail below.

Figure 3:
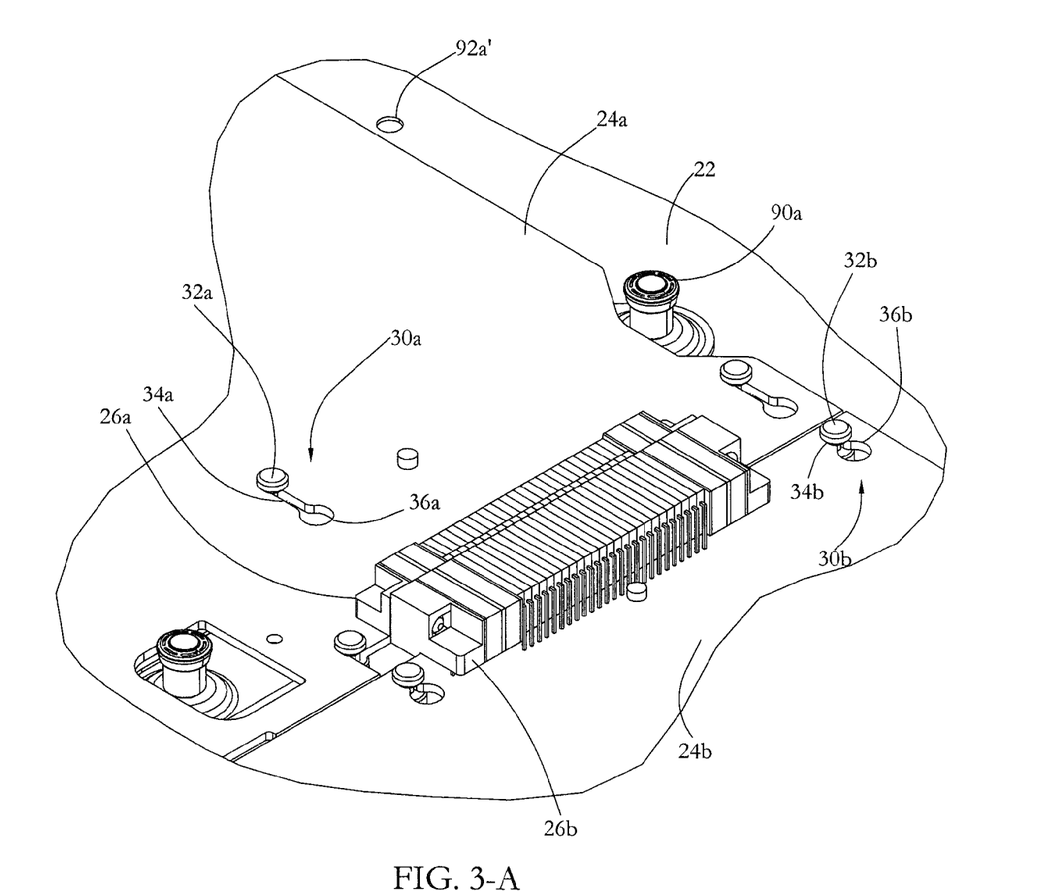

FIG. 3-A-B show isometric and top views of a connection region of PCBs 24a-b in a connected state, according to some embodiments of the present invention. In FIG. 3-A-B, both PCBs 24a-b are in locked positions, with standoffs 32a-b positioned over longitudinal slots 34a-b, opposite insertion apertures 36a-b. Support 22 includes a crank-lock aperture 92a' for receiving the spring-loaded plunger of crank handle 90a when crank handle 90a is in an open position (shown in FIGS. 2-A-B).

Figure 4:
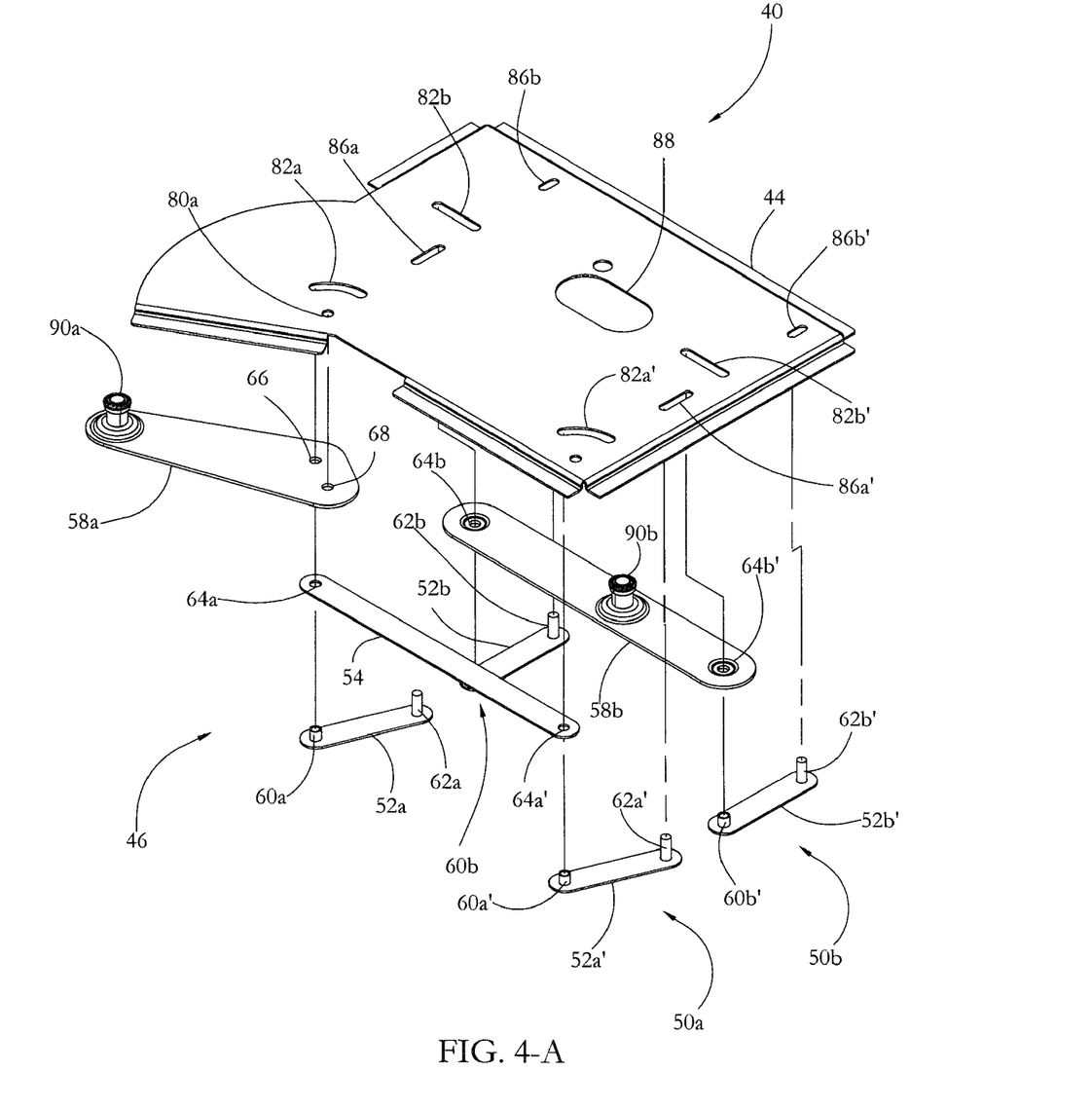

FIG. 4-A-B show exploded and isometric views, respectively, of a printed circuit board translation assembly 40 according to some embodiments of the present invention. Translation assembly 40 includes a fixed planar assembly support 44, and a movable drive assembly 46 coupled to support 44 and PCBs 24a-b. Assembly support 44 and drive assembly 46 are generally parallel to the major plane and direction of motion of PCBs 24a-b. Drive assembly 46 includes a first subassembly 50a coupled to PCB 24a, and a second subassembly 50b coupled to PCB 24b.

Subassembly 50a includes a pair of transversely-spaced, generally longitudinal rigid coupling arms 52a-a', a generally-transverse rigid linking arm 54 pivotally coupled to coupling arms 52a-a', and a leveraging/drive arm formed by a crank 58a pivotally coupled to coupling arm 52a and, through linking arm 54, to coupling arm 52a'. Crank 58a acts as a drive arm, coupling an external force applied by a user to coupling arms 52a-a' to drive a longitudinal motion of PCB 24a. In particular, crank 58a serves as a leveraging arm, leveraging the external applied force into a larger longitudinal force driving PCB 24a. Coupling arms 52a-a' include drive pins 60a-a' and guide pins 62a-a', respectively, situated at opposite longitudinal ends of each coupling arm 52a-a'. Drive pins 60a-a' extend through matching circular apertures 64a-a' defined through linking arm 54 and matching arcuate drive slots (channels) 82a-a' defined through assembly support 44, respectively. Drive pin 60a also extends through a matching circular aperture 66 defined through crank 58a. Guide pins 62a-a' extend through matching longitudinal slots 86a-a' defined through assembly support 44, respectively. Crank 58a and support 44 further include corresponding circular pivot apertures 68 and 80a, respectively, for receiving a pivot pin defining a pivot axis situated at a center of a circle defined by arcuate slot 82a. Crank 58a includes a protruding handle 90a situated at a distal end of crank 58a, opposite apertures 66, 68.

Subassembly 50b includes a pair of transversely-spaced, generally longitudinal rigid coupling arms 52b-b', and a generally-transverse leveraging/drive arm formed by a crank 58b pivotally coupled to coupling arms 52b-b'. Coupling arms 52b-b' include drive pins 60b-b' and guide pins 62b-b', respectively, situated at opposite longitudinal ends of each coupling arm 52b-b'. Drive pins 60b-b' extend through matching circular apertures 64b-b' defined through crank 58b and matching generally-transverse drive slots 82b-b' defined through assembly support 44, respectively. Guide pins 62b-b' extend through matching longitudinal slots 86b-b' defined through assembly support 44, respectively. Crank 58b includes a protruding handle 90b situated between apertures 64b-b'. Handle 90b is accommodated through an aperture 88 defined in assembly support 44.

Figure 5:
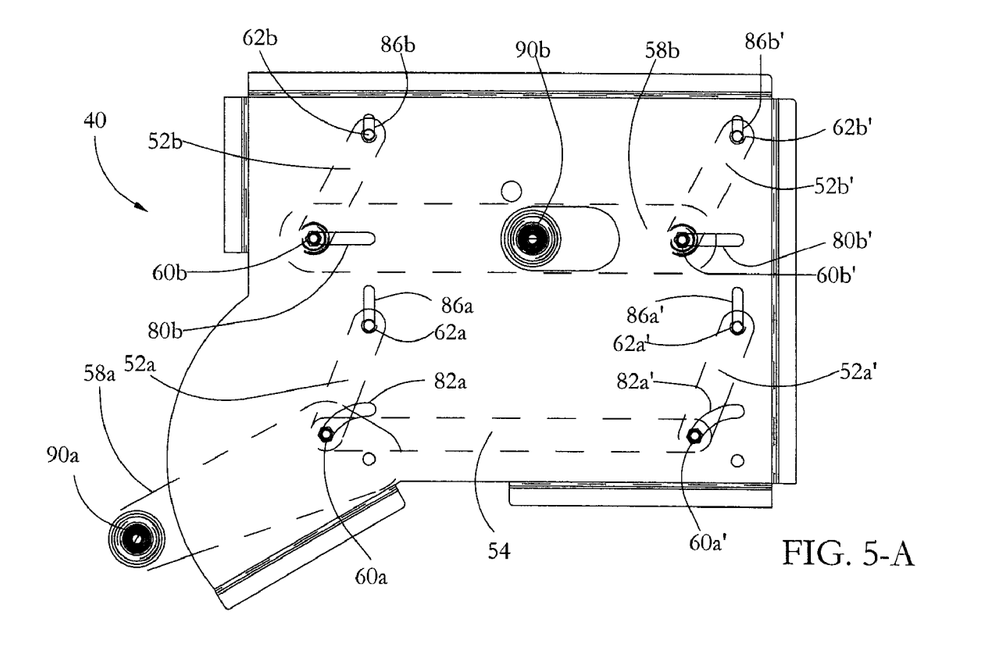

Each crank 58a-b is movable between open and closed positions. In FIG. 4-B, translation assembly 40 is shown with crank 58a in an open position and crank 58b in a closed position. FIG. 5-A shows a top view of translation assembly 40 with both cranks 58a-b in open positions, while FIG. 5-B shows a top view of translation assembly 40 with both cranks 58a-b in closed positions. In the open positions (FIG. 5-A), drive pins 60a-a', 60b-b' are situated at corresponding distal ends of drive slots 82a-a', 82b-b', respectively, and are transversely offset relative to guide pins 62a-a', 62b-b', respectively. An assembly operator uses handles 90a-b to move cranks 58a-b, respectively, to closed positions (FIG. 5-B). As cranks 58a-b are moved, drive pins 60a-a', 60b-b' move along trajectories having transverse components (e.g. arcuate trajectories for drive pins 60a-a', linear transverse trajectories for drive pins 60b-b'), pushing guide pins 62a-a', 62b-b' along longitudinal guide slots 86a-a', 86b-b'. In the closed positions (FIG. 5-B), drive pins 60a-a', 60b-b' are situated at corresponding proximal ends of drive slots 82a-a', 82b-b', respectively, and are transversely aligned to guide pins 62a-a', 62b-b', respectively.

Figure 6:
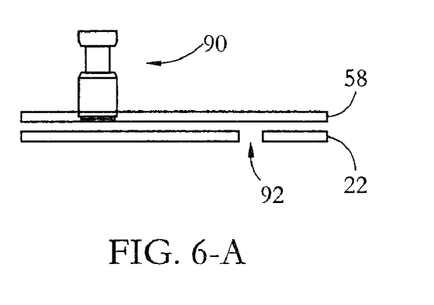

FIGS. 6-A-C show side views of a handle 90 used to move a crank 58 relative to a PCB support 22, according to some embodiments of the present invention. As shown in FIG. 6-C, handle 90 includes a knob having a fixed case 94 and a spring-loaded plunger 96 movable within case 94. PCB 22 includes a crank-lock aperture 92 for receiving spring-loaded plunger 96 when crank 58 is at an end of its excursion, to lock crank 58 in an open position (FIGS. 2-A-B) or closed position (FIGS. 3-A-B). In FIG. 6-A, crank 58 is in an intermediate position between open and closed positions, and plunger 96 is raised to allow crank 58 to move relative to PCB support 22. In FIGS. 6-B-C, crank 58 is locked in an open or closed position. To move crank 58 away from its locked position, an end user pulls on a top region 98 of handle 90 to lift plunger 96 out of crank-lock aperture 92. In some embodiments, PCB support 22 may include multiple crank-lock apertures, for example one aperture for each lock position (open and closed) for each crank (e.g. four apertures for a two-crank assembly).

Figure 7:
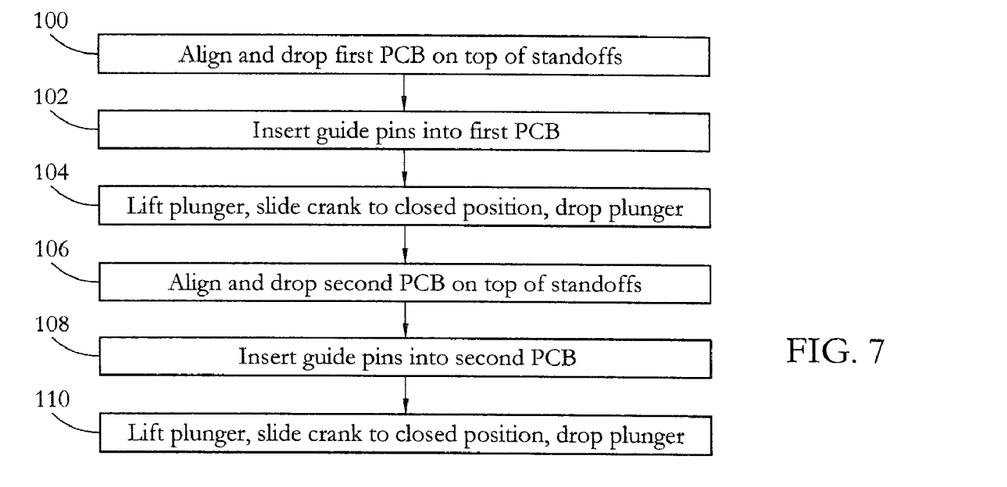
FIG. 7 shows a sequence of steps used to assemble a multi-circuit board system according to some embodiments of the present invention.

FIG. 7 shows a sequence of steps performed to assemble a multi-PCB computer system according to some embodiments of the present invention. In a step 100, a first PCB (e.g. PCB 24b, shown in FIG. 2-A) is aligned with and dropped on corresponding standoffs (see e.g. standoff 32b in FIG. 2-A) mounted on a fixed PCB support (see e.g. PCB support 22 in FIG. 2-A). Guide pins of a PCB translation assembly (e.g. guide pins 62b-b' shown in FIG. 4-A) are inserted into corresponding holes in the PCB (see e.g. PCB 24b in FIG. 2-A) (step 102). In a step 104, a plunger (see e.g. plunger 96 of FIG. 6-C) of the PCB translation assembly is lifted (e.g. by pulling handle 90b in FIG. 4-A), the corresponding translation assembly crank (see e.g. crank 58b in FIGS. 5-A-B) is slid to a closed position (see e.g. FIG. 5-B), and the plunger is dropped into a corresponding PCB support hole to lock the PCB in place. In a step 106, a second PCB (e.g. PCB 24a in FIG. 2-A) is aligned with and dropped on corresponding standoffs (see e.g. standoff 32a in FIG. 2-A) mounted on the fixed PCB support (see e.g. PCB support 22 in FIG. 2-A). Guide pins of the PCB translation assembly (e.g. guide pins 62a-a' in FIG. 4-A) are inserted into corresponding holes in the PCB (see e.g. PCB 24a in FIG. 2-A) (step 108). In a step 110, a plunger (see e.g. plunger 96 in FIG. 6-C) of the PCB translation assembly is lifted (e.g. by pulling handle 90a in FIG. 4-A), the corresponding translation assembly crank (see e.g. crank 58a in FIGS. 5-A-B) is slid to a closed position (see e.g. FIG. 5-B), and the plunger is dropped into a corresponding PCB support hole to lock the PCB in place. Sliding the crank to a closed position establishes a connection between the matching electrical connectors (see e.g. connectors 26a-b of FIG. 2-A) of the two PCBs.

Figure 8:
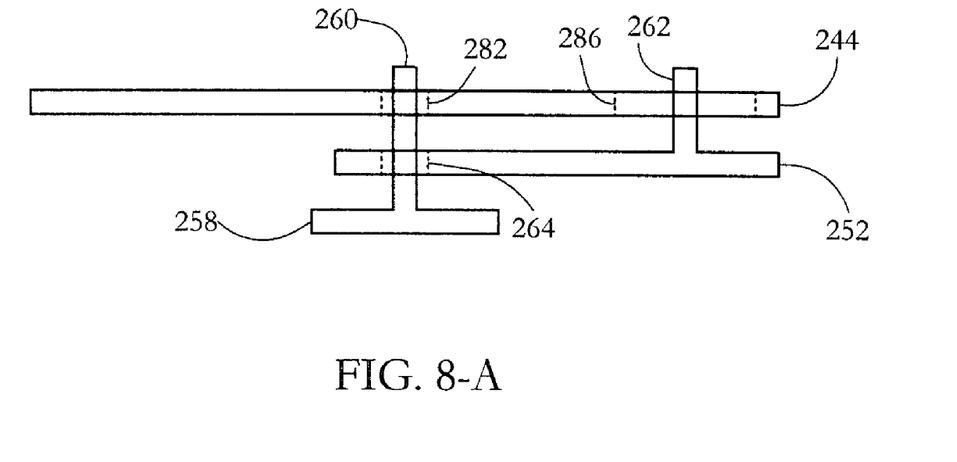

In some embodiments, the exemplary gender configurations for the standoffs and/or pins illustrated above may be reversed, and various components described above may be provided as part of alternative structures or monolithically formed with other structures. FIG. 8-A shows a detail of a translation assembly with a drive pin-slot configuration having reversed gender relative to the configuration shown in FIGS. 4-A-B, according to some embodiments of the present invention. A crank 258 may include or otherwise be rigidly connected to a drive pin 260 passing through a corresponding transverse slot 282 defined in a fixed support 244 and a circular aperture 264 defined in a coupling arm 252. Coupling arm 252 includes or otherwise is rigidly connected to a guide pin 262, which fits through a longitudinal slot 286 defined in support 244.

FIG. 8-B shows a detail of a printed circuit board assembly with a keyhole-standoff configuration having reversed gender relative to the configuration shown in FIGS. 4-A-B, according to some embodiments of the present invention. A PCB 224 includes or is otherwise rigidly connected to a plurality of standoffs 232, which fit through matching keyhole apertures 230 defined in a fixed support 222.

Figure 9:
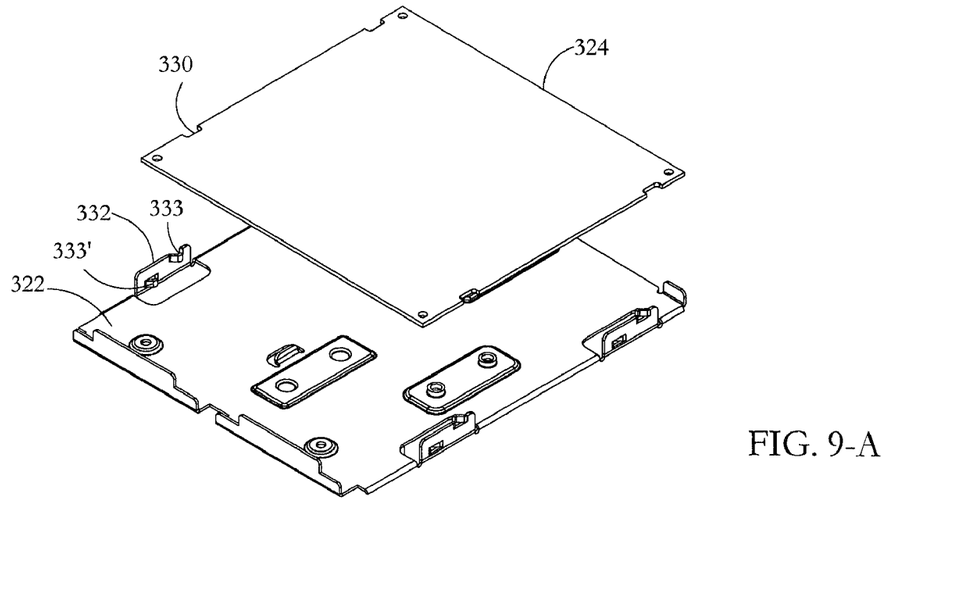

FIGS. 9-A-B illustrate a lateral-notch guiding structure which may be used instead of a keyhole-standoff configuration to constrain PCB in-plane motion, according to some embodiments of the present invention. A translation assembly as described above may be used in conjunction with the lateral-notch guiding structure of FIGS. 9-A-B to controllably place and interconnected two PCBs.

FIG. 9-A shows an isometric view of a PCB 324 and corresponding support plate 322 prior to mounting PCB 324 on support 322, according to some embodiments of the present invention. FIG. 9-B shows an isometric view of PCB 324 and support plate 322 after mounting PCB 324 on support plate 322, according to some embodiments of the present invention. PCB 324 includes multiple notches 330 spaced along opposite edges of PCB 324. Support plate 322 includes corresponding protruding out-of-plane ears 332. Each ear 332 includes lateral in-plane protrusions (e.g. embossments) 333, 333' situated at different heights and offset in-plane relative to each other. To mount PCB 324 on support plate 322, PCB 324 is positioned above support plate 332 with notches 330 aligned with lateral protrusions 333. PCB 324 is dropped into place, and lateral protrusions pass through notches 330. PCB 324 then rests on lateral protrusions 333'. PCB 324 is then slid in-plane, for example using a translation assembly as described above, to a locked position in which notches 330 are not aligned with lateral protrusions 333. In the locked position, the out-of-plane motion of PCB 324 is constrained on opposite sides by lateral protrusions 333, 333'.

In some embodiments, other guiding or leveraging structures than the ones described above may be used to controllably connect electrical connectors. For example, a rail, tab/slot or other guiding structure may be used instead of a pin/slot guiding structure. In some embodiments, a first PCB or other electrical connector support may be held in place by screws or other fixed fasteners, while a second PCB or other second electrical connector support is moved relative to the first PCB as described above.

The exemplary electrical connection assemblies described above allow electrically connecting two co-planar PCBs or other components having electrical connectors in the presence of tight spatial/access constraints. A linear crank motion may be used to controllably position and orient the first PCB, while a circular crank motion may be used to controllably position and orient the second PCB and press the two PCBs together to establish an electrical connection between matching connectors on the two PCBs. Positioning the first PCB may require relatively low levels of applied force, and may be well suited for the linear-motion crank configuration, which is relatively compact. Pressing the two electrical connectors together may require higher levels of applied force, and may be well suited for the more highly-leveraged arcuate-motion crank configuration, which may use more space but allows applying higher force levels. In some embodiments, a leveraged arcuate-motion crank/slider arrangement as described above may be used to provide a leverage ratio (ratio of force applied to electrical connector to external force applied by user) on the order of 5:1 or higher (e.g. about 6.75 to 1 in some embodiments), which allows applying connector insertion forces of 70-90 lbs. with little operator effort.

In exemplary embodiments described above, the PCB electrical connectors are self-guided together by the connection assembly, and connecting the PCBs together does not require high operator accuracy in aligning the electrical connectors.

The mating process may be performed blindly, while the connectors are not visible to the operator. The connectors may be brought together and pulled apart along a controlled trajectory and with controlled orientation and velocity, allowing minimizing any damage to connector pins. Furthermore, applying positioning and connection forces within the PCB plane as described above allows minimizing the strain on the PCBs.

It will be clear to one skilled in the art that the above embodiments may be altered in many ways without departing from the scope of the invention. Accordingly, the scope of the invention should be determined by the following claims and their legal equivalents.

What is claimed is:

1. An apparatus comprising:
   a first printed circuit board having a first edge electrical connector;
   a second printed board substantially co-planar with the first printed circuit board and having a second edge electrical connector facing the first edge electrical connector; and
   an in-plane translation assembly coupled to the first printed circuit board, for moving the first printed circuit board relative to the second printed board within a major plane of the first printed circuit board and the second printed circuit board to connect the first edge electrical connector to the second edge electrical connector, the translation assembly comprising
      a fixed translation assembly support,
      a first coupling arm substantially parallel to the major plane and rigidly connected to the first printed circuit board, and
      a first leveraging arm substantially parallel to the major plane and coupled to the first coupling arm and to the fixed translation assembly support, for leveraging an external applied force to move the first coupling arm and thereby move the first printed circuit board relative to the second printed circuit board within the major plane to connect the first edge electrical connector to the second edge electrical connector.

2. The apparatus of claim 1, wherein:
   the fixed translation assembly support comprises a longitudinal guide slot and a transverse drive slot; and
   the translation assembly further comprises
      a first coupling member passing through the longitudinal guide slot and rigidly connecting the first coupling arm to the first printed circuit board, and
      a second coupling member passing through the transverse drive slot and rigidly connecting the first coupling arm to the first leveraging arm.

3. The apparatus of claim 2, wherein the transverse drive slot has a substantially linear shape in a section parallel to the major plane.

4. The apparatus of claim 2, wherein the transverse drive slot has an arcuate shape in a section parallel to the major plane.

5. The apparatus of claim 4, wherein:
   the fixed translation assembly support further comprises a pivot aperture situated at a center defined by the arcuate shape, and
   the translation assembly further comprises a pivot member passing through the pivot aperture and connecting the leveraging arm to the fixed translation assembly support to form a pivot point for a rotation of the leveraging arm.

6. The apparatus of claim 1, wherein the first leveraging arm comprises a rotatable crank coupled to the fixed translation assembly support and the first coupling arm, the crank having a pivot point connected to the fixed translation assembly support, and a rotation point connected to the first coupling arm and rotatable about the pivot point.

7. The apparatus of claim 1, wherein the first printed circuit board is coupled to the fixed translation assembly support through a plurality of standoffs extending through a corresponding plurality of keyhole apertures.

8. The apparatus of claim 7, further comprising a fixed printed circuit board support comprising the plurality of standoffs, the fixed printed circuit board support being coupled to the fixed translation assembly support, wherein the plurality of keyhole apertures are formed in the first printed circuit board.

9. The apparatus of claim 1, wherein the translation assembly further comprises a spring-loaded plunger coupled to the leveraging arm, and wherein the fixed translation assembly support includes a depression positioned to accommodate the spring-loaded plunger to lock the leveraging arm in position relative to the fixed translation assembly support.

10. The apparatus of claim 1, wherein the fixed translation assembly support comprises a metallic plate.

11. The apparatus of claim 1, wherein the translation assembly further comprises:
    a second coupling arm substantially parallel to the major plane and rigidly connected to the second printed circuit board; and
    a second leveraging arm substantially parallel to the major plane and coupled to the second coupling arm and to the fixed translation assembly support, for moving the second coupling arm within the major plane and thereby move the second printed circuit board within the major plane.

12. An in-plane printed circuit board translation assembly comprising:
    a fixed support plate having a major plane, the fixed support plate including a longitudinal guide slot and a transverse drive slot;
    a coupling arm substantially parallel to the major plane,
    an out-of-plane guide pin connected to the coupling arm and passing through the longitudinal guide slot, for connecting to a printed circuit board to translate the printed circuit board along a trajectory defined by the longitudinal guide slot;
    a drive arm substantially parallel to the major plane and pivotally connected to the coupling arm; and
    an out-of-plane drive pin pivotally connecting the coupling arm to the drive arm and passing through the transverse drive slot, for coupling a motion of the drive arm to the coupling arm to drive the guide pin along the longitudinal guide slot.

13. An apparatus comprising:
    a support plate having
       a pair of first longitudinal guiding slots extending through the support plate along a major surface of the support plate and spaced apart along a transverse direction, and
       a pair of second longitudinal guiding slots extending through the support plate along the major surface and spaced apart along the transverse direction;
    a first printed circuit board translation assembly for coupling to a first printed circuit board and longitudinally translating the first printed circuit board relative to the support plate, the first translation assembly comprising:
       a pair of first rigid coupling arms substantially parallel to the major surface, each first coupling arm including a first pin substantially normal to the major surface, the first pin extending through a corresponding first slot of the pair of first slots and slidable longitudinally within the corresponding first slot; and a first transverse rigid linking arm interconnecting the pair of first coupling arms to longitudinally interlock the pair of first coupling arms;

a second printed circuit board translation assembly for coupling to a second printed circuit board and longitudinally translating the second printed circuit board relative to the support plate to mate with the first printed circuit board, the second translation assembly comprising a pair of second rigid coupling arms substantially parallel to the major surface, each second coupling arm including a second pin substantially normal to the major surface, the second pin extending through a corresponding second slot of the pair of second slots and slidable longitudinally within the corresponding second slot.

14. The apparatus of claim 13, wherein the second translation assembly comprises a second rigid linking arm interconnecting the pair of second coupling arms to longitudinally interlock the pair of first coupling arms.

15. A method of electrically connecting a pair of co-planar printed circuit boards, comprising:

connecting a coupling arm to a first printed circuit board of the pair of printed circuit boards;

connecting a leveraging arm to the coupling arm and to a fixed support; and employing the leveraging arm to leverage an external force applied to the leveraging arm to move the coupling arm along a plane of the printed circuit boards to connect a first electrical connector situated along an edge of the first printed circuit board to a second electrical connector situated along an edge of the second printed circuit board.

16. The method of claim 15, further comprising:

connecting the coupling arm to the first printed circuit board through a first coupling member perpendicular to the plane of the printed circuit boards and passing through a longitudinal guide slot defined in the fixed support; and connecting the leveraging arm to the coupling arm through a second coupling member perpendicular to the plane of the printed circuit boards and passing through a transverse drive slot defined in the fixed support.

17. The method of claim 16, wherein the transverse drive slot has a substantially linear shape in a section parallel to the plane of the printed circuit boards.

18. The method of claim 16, wherein the transverse drive slot has an arcuate shape in a section parallel to the plane of the printed circuit boards.

19. The method of claim 18, further comprising connecting the leveraging arm to the fixed support through a pivot member perpendicular to the plane of the printed circuit boards and passing through a pivot aperture situated at a center defined by the arcuate shape, the center defining a pivot point for a rotation of the leveraging arm.

20. The method of claim 15, further comprising connecting the printed circuit board to a fixed support through a plurality of standoffs extending through a corresponding plurality of keyhole apertures.

21. The method of claim 20, wherein the plurality of keyhole apertures are formed in the printed circuit board.

22. The method of claim 15, further comprising accommodating a spring-loaded plunger of the leveraging arm in a depression formed in a fixed support to lock the leveraging arm in position relative to the fixed support.

23. A printed circuit board connection method comprising:

locking a first circuit board having a first edge electrical connector in a first mating position; and connecting a second edge electrical connector of a second printed circuit board to the first edge electrical connector by transversely moving a crank to longitudinally slide a pair of pins coupled to the crank and the second printed circuit board through a corresponding pair of longitudinal slots to lock the second printed circuit board in a second mating position.

* * * * *